(12) United States Patent
Sommer et al.

(10) Patent No.: US 12,272,762 B2
(45) Date of Patent: Apr. 8, 2025

(54) PROCESS FOR MANUFACTURING AN ELECTROLUMINESCENT DEVICE

(71) Applicant: COMMISSARIAT A L'ENERGIE ATOMIQUE ET AUX ENERGIES ALTERNATIVES, Paris (FR)

(72) Inventors: Romain Sommer, Grenoble (FR); Zouhir Mehrez, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 18/766,529

(22) Filed: Jul. 8, 2024

(65) Prior Publication Data
US 2025/0015224 A1    Jan. 9, 2025

(30) Foreign Application Priority Data

Jul. 9, 2023 (FR) ...................................... 2307326

(51) Int. Cl.
| | |
|---|---|
| H01L 33/00 | (2010.01) |
| H01L 33/06 | (2010.01) |
| H01L 33/08 | (2010.01) |
| H01L 33/24 | (2010.01) |
| H01L 33/32 | (2010.01) |
| H01L 33/44 | (2010.01) |

(52) U.S. Cl.
CPC ............ *H01L 33/007* (2013.01); *H01L 33/06* (2013.01); *H01L 33/08* (2013.01); *H01L 33/24* (2013.01); *H01L 33/32* (2013.01); *H01L 33/44* (2013.01); *H01L 2933/0025* (2013.01)

(58) Field of Classification Search
CPC ............................................. H01L 2933/0025
USPC ............................................................ 438/35
See application file for complete search history.

(56) References Cited

U.S. PATENT DOCUMENTS

2018/0198047 A1 * 7/2018 Danesh .................. H01L 33/24
2019/0333963 A1   10/2019 Chio et al.

FOREIGN PATENT DOCUMENTS

WO   WO 2022/043053 A1   3/2022

OTHER PUBLICATIONS

Preliminary Search Report & Written Opinion issued Jan. 22, 2024, in corresponding French Patent Application No. FR2307326, 11 pages.

* cited by examiner

*Primary Examiner* — Hsin Yi Hsieh
(74) *Attorney, Agent, or Firm* — Oblon, McClelland, Maier & Neustadt, L.L.P.

(57) ABSTRACT

A process for manufacturing an electroluminescent device, comprising: (a) using a stack comprising, successively: a substrate having a surface; matrix arrays of pixels formed on the surface of the substrate, of columnar shape; an encapsulating layer arranged to cover the matrix arrays of pixels; a dielectric layer formed on the encapsulating layer; (b) performing a directional etch along the normal to the surface of the substrate, of a portion of the dielectric layer extending between the pixels of the matrix arrays of pixels; the dielectric layer having a portion remaining at the end of step (b); and (c) performing a selective chemical etch of the remaining portion of the dielectric layer with a chemical etchant that permits selective etching of the remaining portion of the dielectric layer with respect to the encapsulating layer.

10 Claims, 7 Drawing Sheets

PROCESS FOR MANUFACTURING AN ELECTROLUMINESCENT DEVICE

TECHNICAL FIELD

The invention relates to the technical field of the manufacture of electroluminescent devices.

The invention is in particular applicable to the manufacture of light-emitting diodes based on nanowires, in particular gallium nitride (GaN) nanowires.

PRIOR ART

A known prior-art process for manufacturing an electroluminescent device comprises the following steps:
A) using a stack comprising, successively:
  a substrate, having a surface;
  matrix arrays of pixels formed on the surface of the substrate, the pixels having a columnar shape and extending along the normal to the surface of the substrate;
  an encapsulating layer arranged to cover the matrix arrays of pixels;
  a dielectric layer formed on the encapsulating layer;
B) performing a plasma etch of the dielectric layer;
C) forming a coloured resin on the encapsulating layer at the end of step B), the coloured resin being customized for filtration of an emission spectrum of an underlying pixel.

The encapsulating layer may be made of silicon nitride ($Si_3N_4$). The dielectric layer is generally made of silicon dioxide ($SiO_2$).

Such a process of the prior art is not wholly satisfactory in that the strong bombardment with ionized gas in step B) is liable to cause significant degradation of the pixels. This degradation is all the more pronounced, the greater the aspect ratio (ratio between the height and width of the pixels) of the pixels. It has been found experimentally that the upper portion of the pixels can develop a slant at the end of step B).

Moreover, when the dielectric layer is made of silicon dioxide ($SiO_2$), step B) is conventionally carried out using a fluorine-containing plasma, such as a carbon tetrafluoride ($CF_4$) plasma. However, the etch depth is strongly dependent on the carbon/fluorine ratio of the plasma. Variation in the relative surface of the carbon mask can result in an "etch stop", this undesirable phenomenon being all the more pronounced the greater the thickness of the dielectric layer to be etched.

SUMMARY OF THE INVENTION

The invention aims to fully or partially address the aforementioned drawbacks. To this end, the invention provides a process for manufacturing an electroluminescent device, comprising the following steps:
a) using a stack comprising, successively:
  a substrate, having a surface;
  matrix arrays of pixels formed on the surface of the substrate, the pixels having a columnar shape and extending along the normal to the surface of the substrate;
  an encapsulating layer arranged to cover the matrix arrays of pixels;
  a dielectric layer formed on the encapsulating layer;
b) performing a directional etch along the normal to the surface of the substrate, of a portion of the dielectric layer extending between the pixels of the matrix arrays of pixels; the dielectric layer having a portion remaining at the end of step b);
c) performing a selective chemical etch of the remaining portion of the dielectric layer, step c) being carried out with a chemical etchant that permits selective etching of the remaining portion of the dielectric layer with respect to the encapsulating layer.

Such a process according to the invention accordingly makes it possible, by virtue of steps b) and c), to afford better protection to columnar pixels compared to the prior art. Specifically, the directional etch (e.g. plasma etch) carried out during step b) affects only inter-pixel areas. The upper portion of the pixels is protected from a possible strong ion bombardment, because the portion of the dielectric layer lying above the upper portion of the pixels is not etched during step b). Unlike bombardment with ionized gas, the selective chemical etch carried out during step c) makes it possible to etch the remaining portion of the dielectric layer without significantly affecting the upper portion of the pixels.

Moreover, the selective chemical etch carried out during step c) makes it possible to overcome the etch stop problems of the prior art associated with plasma etching when the dielectric layer has a high thickness (e.g. 8 µm to 10 µm).

The process according to the invention may comprise one or more of the following features.

According to one feature of the invention, the process includes a step d) of forming at least one coloured resin on the encapsulating layer at the end of step c), said at least one coloured resin being customized for filtration of an emission spectrum of an underlying pixel.

According to one feature of the invention:
step b) is carried out with a photolithography mask having patterns arranged to face the pixels of the matrix arrays of pixels;
step c) is preceded by a step $c_0$) of removing the photolithography mask.

Thus, an advantage obtained is the protection of the upper portion of the pixels during step b). By virtue of the photolithography mask having patterns arranged to face the pixels of the matrix arrays of pixels, the portion of the dielectric layer lying above the upper portion of the pixels is not etched during step b).

According to one feature of the invention, step b) is preceded by the following steps:
$b_{01}$) forming a trench between adjacent matrix arrays of pixels that has a bottom wall and side walls;
$b_{02}$) depositing a barrier layer on the bottom wall and on the side walls, the barrier layer being made of a material selected according to the chemical etchant with which step c) is carried out, so as to obtain an etch stop layer during performance of step c).

Thus, an advantage obtained by a trench formed between two adjacent matrix arrays of pixels is to limit crosstalk effects. In addition, the barrier layer makes it possible to better control the extent of the selective (isotropic) chemical etch carried out during step c).

According to one feature of the invention, the chemical etchant with which step c) is carried out is vapour-phase hydrofluoric acid (HF).

Thus, an advantage obtained by vapour-phase hydrofluoric acid (HF) is that it is compatible, in terms of etch selectivity, with a plurality of materials, in particular aluminium (Al), alumina ($Al_2O_3$) and aluminium nitride (AlN), this affording a greater choice than wet etching for the materials of the barrier layer and the encapsulating layer.

According to one feature of the invention, the barrier layer deposited during step $b_{02}$) is made of at least one material selected from aluminium (Al), alumina ($Al_2O_3$) and aluminium nitride (AlN).

According to one feature of the invention, step b) is preceded by a step $b_{03}$) of filling the trench with tungsten (W) at the end of step $b_{02}$).

Thus, an advantage obtained is to reinforce the mechanical strength of the trenches.

According to a feature of the invention, step b) is preceded by an initial directional etch along the normal to the surface of the substrate, of a surface portion of the dielectric layer so as to reach a position in the stack situated above the pixels of the matrix arrays of pixels at a distance from the encapsulating layer.

Thus, an advantage obtained is to limit the processing time for the selective chemical etch performed during step c), the surface portion of the dielectric layer already having been etched beforehand. Of course, the position reached at the end of the initial directional etch (e.g. plasma etch) must be a sufficient distance from the encapsulating layer so as not to damage the upper portion of the pixels by the strong bombardment with ionized gas.

According to one feature of the invention, the encapsulating layer of the stack used in step a) is made of at least one material selected from aluminium (Al), alumina ($Al_2O_3$) and aluminium nitride (AlN).

According to one feature of the invention, the dielectric layer of the stack used in step a) is made of silicon dioxide ($SiO_2$).

Definitions

"Substrate" is understood to mean a self-supporting physical carrier made of a base material from which an electroluminescent device may be formed. A substrate may be a "wafer", generally taking the form of a disc obtained by cutting an ingot of a crystalline material.

"Pixels" is understood to mean light-emitting (emissive) cells.

"Columnar shape" is understood to mean that the pixels all have an aspect ratio strictly greater than 1, preferably strictly greater than 2, more preferably strictly greater than 3. The aspect ratio is the ratio between the height (i.e. thickness) of the pixel and its width. The height (thickness) of the pixel is its dimension along the normal to the surface of the substrate. An example of structures having such a columnar shape may be a nanowire.

"Successively" is understood to mean that the elements of the stack are arranged one on top of the other in a defined order from bottom to top under the normal conditions of use, that is to say along the normal to the surface of the substrate in general.

"Layer" is understood to mean a single layer or two or more sublayers of the same nature.

"Directional etch" is understood to mean an anisotropic etch taking place in a favoured direction, in this case along the normal to the surface of the substrate.

"Selective etch" is understood to mean that the remaining portion of the dielectric layer can be etched without attacking the encapsulating layer. In practice, the etchant is generally selected such that the etch rate of the remaining portion of the dielectric layer is at least 3 times greater (preferably at least 5 times greater, more preferably at least 10 times greater) than the etch rate of the encapsulating layer.

BRIEF DESCRIPTION OF THE DRAWINGS

Other features and advantages will become apparent from the detailed description of various embodiments of the invention, the description being accompanied by examples and references to the appended drawings.

It should be noted that, for the sake of legibility and ease of understanding, the drawings described above are schematic and not necessarily to scale. The cross sections are made normal to the surface of the substrate.

DETAILED DESCRIPTION OF EMBODIMENTS

For the sake of simplicity, elements that are identical or that perform the same function in the various embodiments have been designated with the same references.

The invention provides a process for manufacturing an electroluminescent device, comprising the following steps:
a) using a stack comprising, successively:
   a substrate 1, having a surface 10;
   matrix arrays of pixels 2 formed on the surface 10 of the substrate 1, the pixels 2 having a columnar shape and extending along the normal to the surface 10 of the substrate 1;
   an encapsulating layer 3 arranged to cover the matrix arrays of pixels 2;
   a dielectric layer 4 formed on the encapsulating layer 3;
b) performing a directional etch along the normal to the surface 10 of the substrate 1, of a portion of the dielectric layer 4 extending between the pixels 2 of the matrix arrays of pixels 2; the dielectric layer 4 having a portion 40 remaining at the end of step b);
c) performing a selective chemical etch of the remaining portion 40 of the dielectric layer 4, step c) being carried out with a chemical etchant that permits selective etching of the remaining portion 40 of the dielectric layer 4 with respect to the encapsulating layer 3.

Step a)

Figure 1:
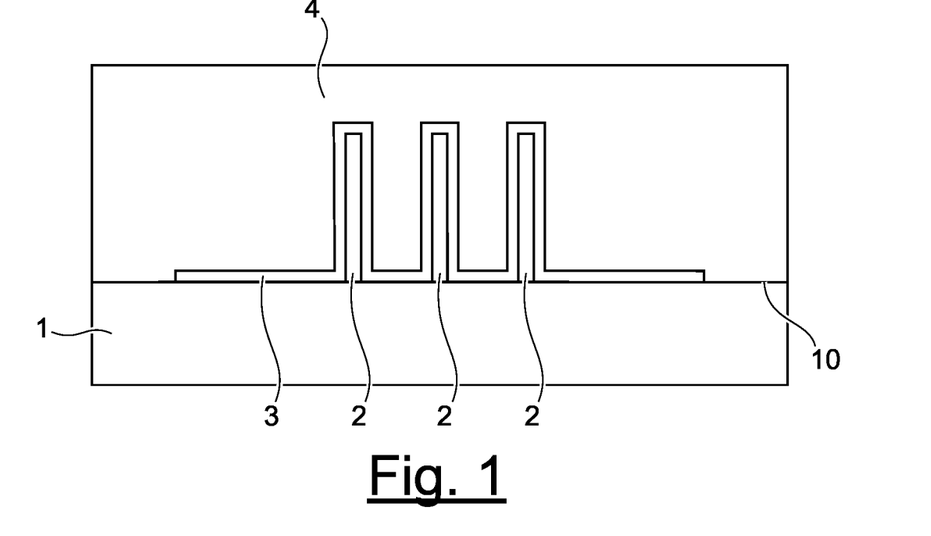
FIG. 1 is a schematic cross-sectional view illustrating step a) of a process according to the invention.

As shown in FIG. 1, the stack used in step a) comprises successively:
- a substrate 1, having a surface 10;
- matrix arrays of pixels 2 formed on the surface 10 of the substrate 1, the pixels 2 having a columnar shape and extending along the normal to the surface 10 of the substrate 1;
- an encapsulating layer 3 arranged to cover the matrix arrays of pixels 2;
- a dielectric layer 4 formed on the encapsulating layer 3.

The substrate 1 is advantageously made of a semiconductor material. By way of non-limiting example, the substrate 1 may be made of silicon (Si).

By way of non-limiting example, the pixels 2 may be nanowires, in particular gallium nitride (GaN) nanowires. The pixels 2 advantageously form periodic patterns.

The encapsulating layer 3 of the stack used in step a) is advantageously made of at least one material selected from aluminium (Al), alumina ($Al_2O_3$) and aluminium nitride (AlN). "At least one material" is understood to mean that the encapsulating layer 3 may be made of a multilayer material comprising at least one material selected from aluminium (Al), alumina ($Al_2O_3$) and aluminium nitride (AlN). The encapsulating layer 3 of the stack used in step a) may have a thickness of the order of 1 µm.

The dielectric layer 4 of the stack used in step a) is advantageously made of silicon dioxide ($SiO_2$). The dielectric layer 4 of the stack used in step a) may have a thickness of between 8 µm and 10 µm.

Step b)

Figure 8:
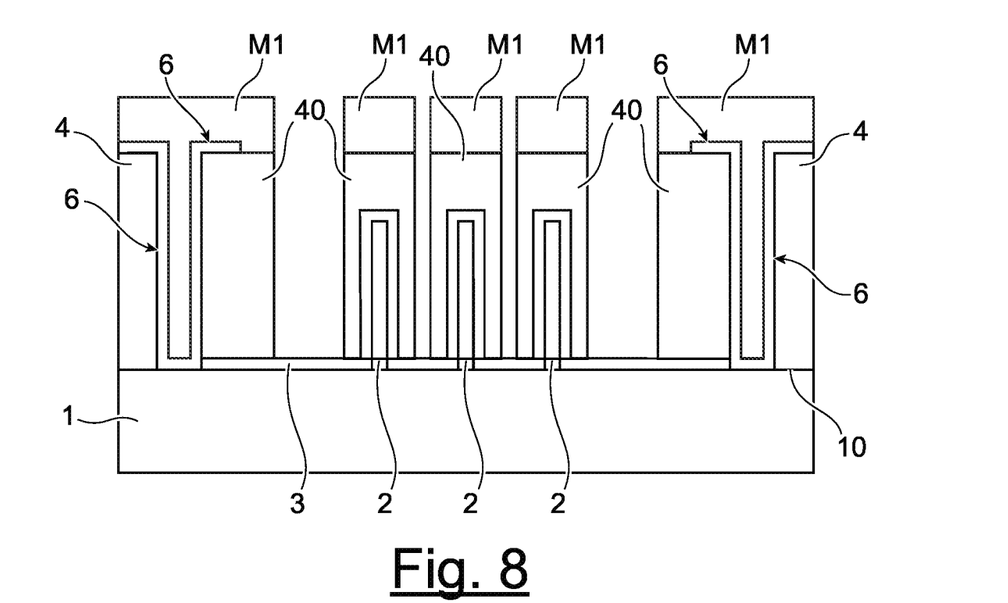
FIG. 8 is a schematic cross-sectional view illustrating the directional etch in step b) of a process according to the invention.

As illustrated in FIG. 8, the directional etch performed during step b) is a directional etch along the normal to the surface 10 of the substrate 1, of a portion of the dielectric layer 4 extending between the pixels 2 of the matrix arrays of pixels 2.

By way of non-limiting example, the directional etch carried out during step b) is a dry plasma etch. When the dielectric layer 4 is made of silicon dioxide, step b) may be carried out using a fluorine-containing plasma, such as a carbon tetrafluoride ($CF_4$) plasma.

Figure 7:
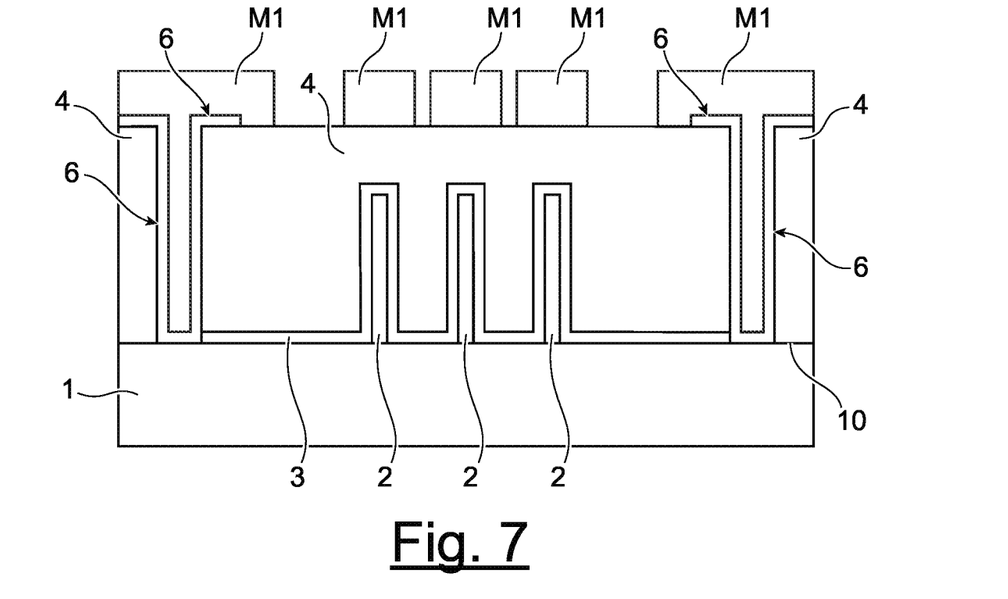
FIG. 7 is a schematic cross-sectional view illustrating the application of a photolithography mask for the directional etch in step b) of a process according to the invention.

As illustrated in FIGS. 7 and 8, step b) is advantageously carried out with a photolithography mask M1 having patterns arranged to face the pixels 2 of the matrix arrays of pixels 2. In other words, the patterns of the photolithography mask M1 lie above the pixels 2 of the matrix arrays of pixels 2.

The dielectric layer 4 has a portion 40 remaining at the end of step b). The remaining portion 40 of the dielectric layer 4 extends beneath the patterns of the photolithography mask M1.

Figure 2:
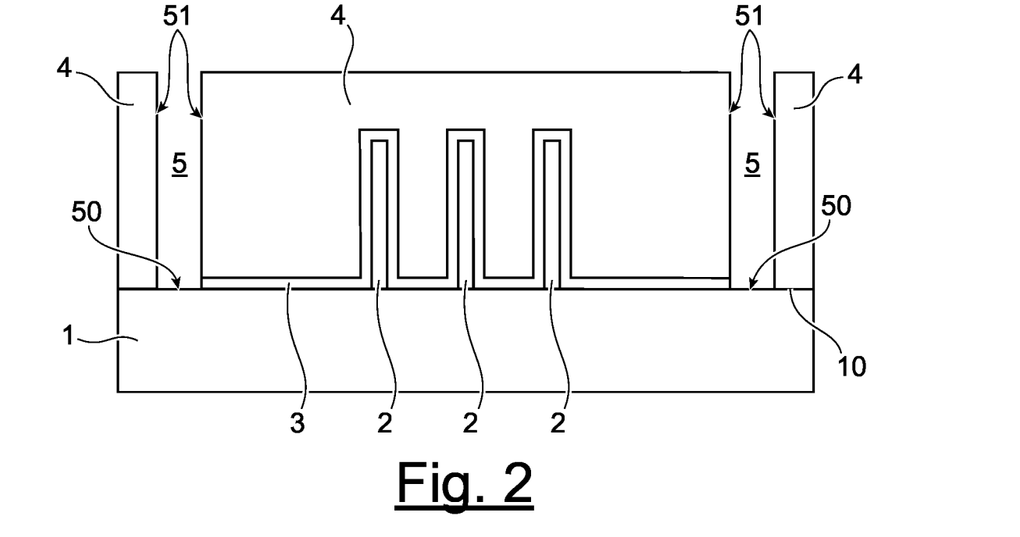
FIG. 2 is a schematic cross-sectional view illustrating step $b_{01}$) of a process according to the invention.
Figure 3:
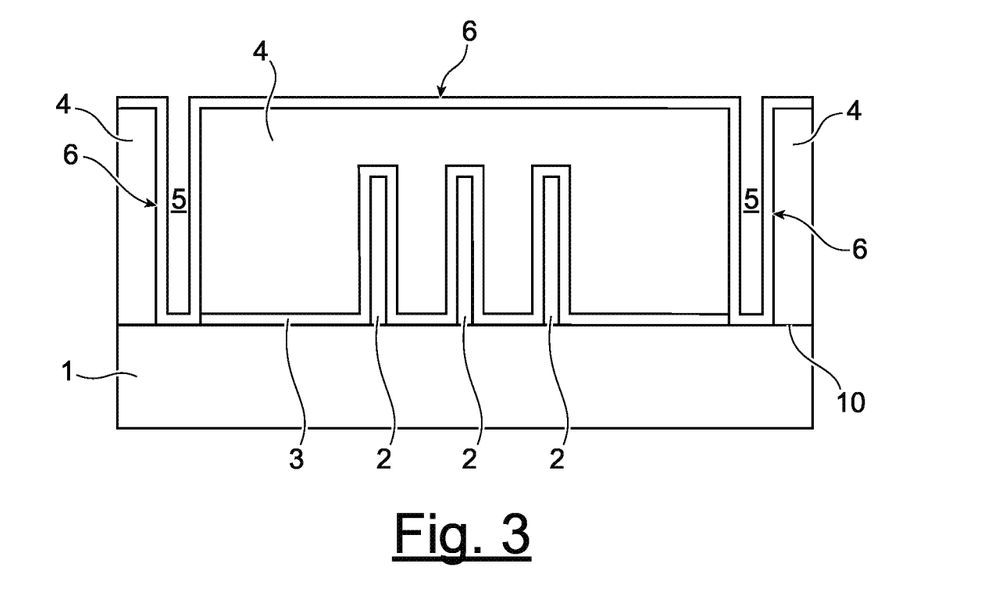
FIG. 3 is a schematic cross-sectional view illustrating step $b_{02}$) of a process according to the invention.

Step b) is advantageously preceded by the following steps:
- $b_{01}$) forming a trench 5 (as illustrated in FIG. 2) between adjacent matrix arrays of pixels 2 that has a bottom wall 50 and side walls 51;
- $b_{02}$) depositing a barrier layer 6 (as illustrated in FIG. 3) on the bottom wall 50 and on the side walls 51, the barrier layer 6 being made of a material selected according to the chemical etchant with which step c) is carried out, so as to obtain an etch stop layer during performance of step c).

The side walls 51 of the trench 5 are formed by the dielectric layer 4. The bottom wall 50 of the trench 5 is formed by the surface 10 of the substrate 1. By way of non-limiting example, step $b_{01}$) may be carried out by a dry plasma etch. When the dielectric layer 4 is made of silicon dioxide ($SiO_2$), step $b_{01}$) may comprise an etch by a $C_4F_8$ plasma. Step $b_{01}$) may comprise an etch of the encapsulating layer 3, for example by a chlorine-containing plasma (e.g. $Cl_2$ or $BCl_3$) when the encapsulating layer 3 is made of aluminium (Al) or alumina ($Al_2O_3$). Step $b_{01}$) is advantageously carried out by a directional etch along the normal to the surface 10 of the substrate 1.

Step $b_{02}$) is carried out by a deposition technique that permits the barrier layer 6 to follow the surface topology of the stack. It is not strictly necessary for the deposition technique to produce conformal deposition (degree of conformity equal to 100%). In other words, the deposition technique is selected so as to have a degree of conformity (ratio between the width of the flanks of the deposited barrier layer 6 and the thickness at the surface of the deposited barrier layer 6) that makes it possible to follow the surface topology of the stack. By way of non-limiting examples, the barrier layer 6 may be formed during step $b_{02}$) by chemical vapour deposition or by atomic layer deposition (ALD), these deposition techniques having a good degree of conformity.

The barrier layer 6 deposited during step $b_{02}$) is advantageously made of at least one material selected from aluminium (Al), alumina ($Al_2O_3$) and aluminium nitride (AlN). "At least one material" is understood to mean that the barrier layer 6 may be made of a multilayer material comprising at least one material selected from aluminium (Al), alumina ($Al_2O_3$) and aluminium nitride (AlN).

Figure 4:
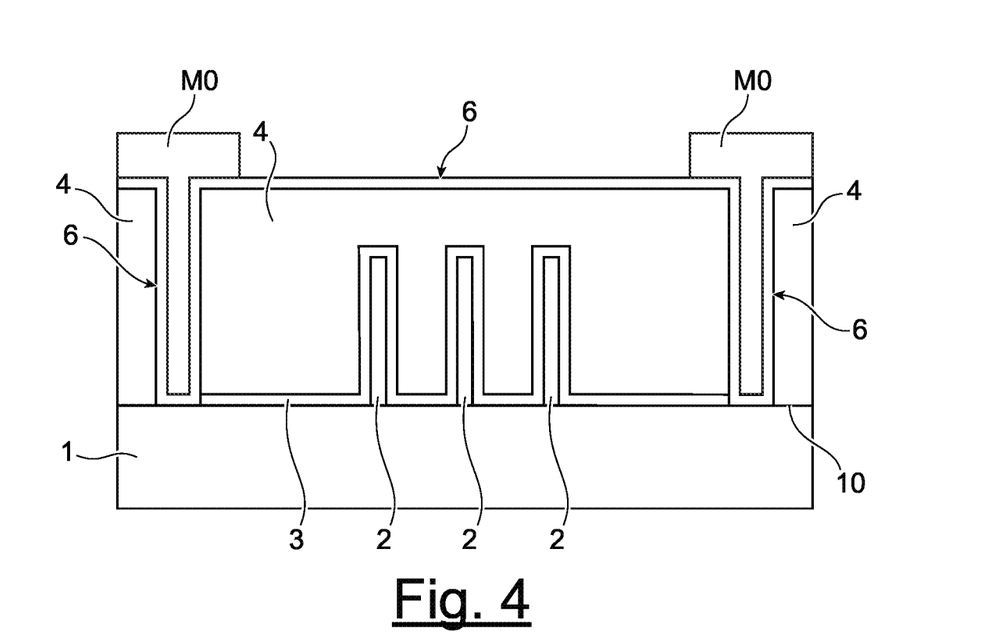
FIG. 4 is a schematic cross-sectional view illustrating the application of a photolithography mask for the etching of the barrier layer.
Figure 5:
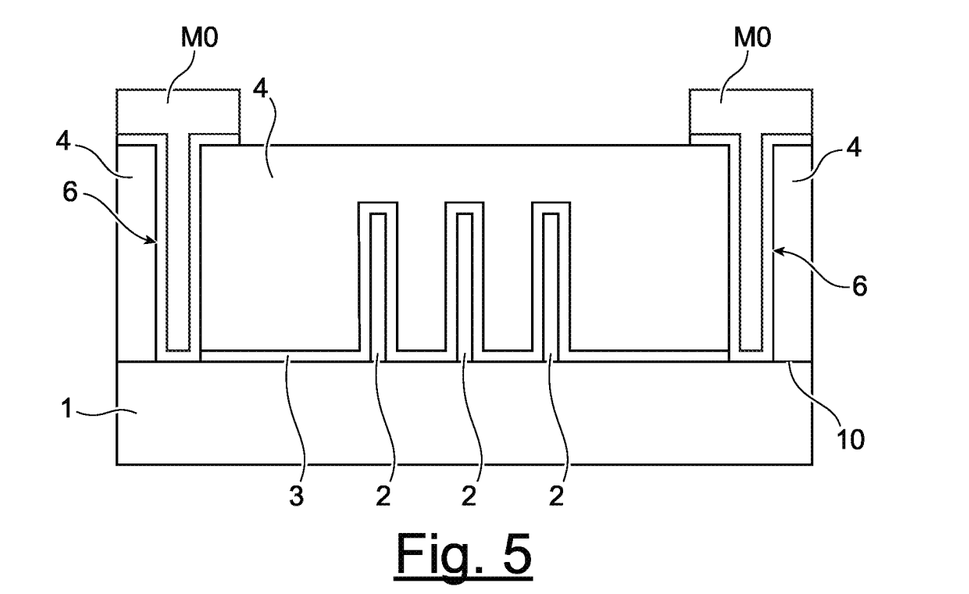
FIG. 5 is a schematic cross-sectional view illustrating the etching of the barrier layer.
Figure 6:
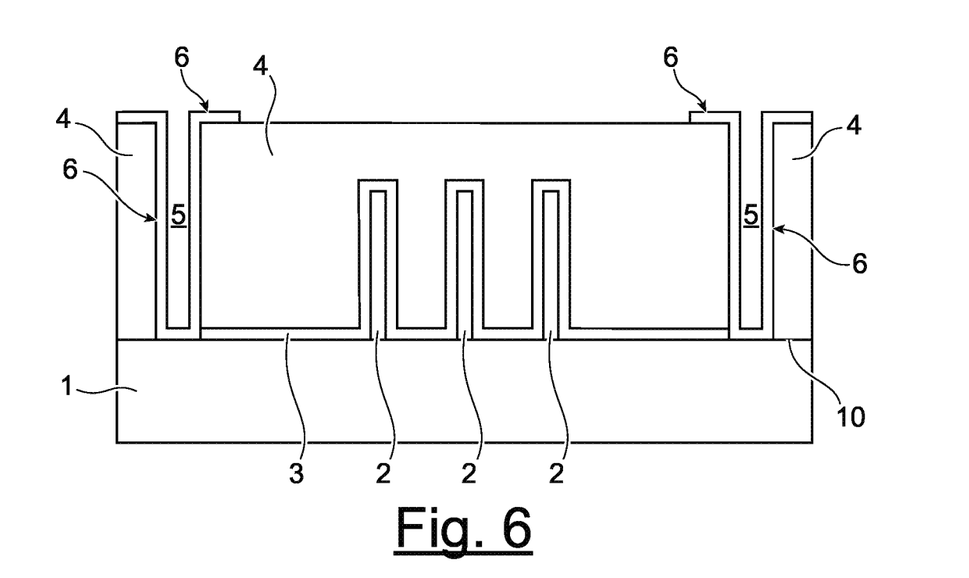
FIG. 6 is a schematic cross-sectional view illustrating the removal of the photolithography mask illustrated in FIG. 4.

In preparation for the directional etch in step b), a portion of the barrier layer 6 (extending between the trenches 5) is etched using a photolithography mask M0 (as illustrated in FIGS. 4 and 5), the patterns of which cover the trenches 5. The photolithography mask M0 may be a photosensitive resin that is then removed from the stack by a stripping technique, as illustrated in FIG. 6.

Figure 13:
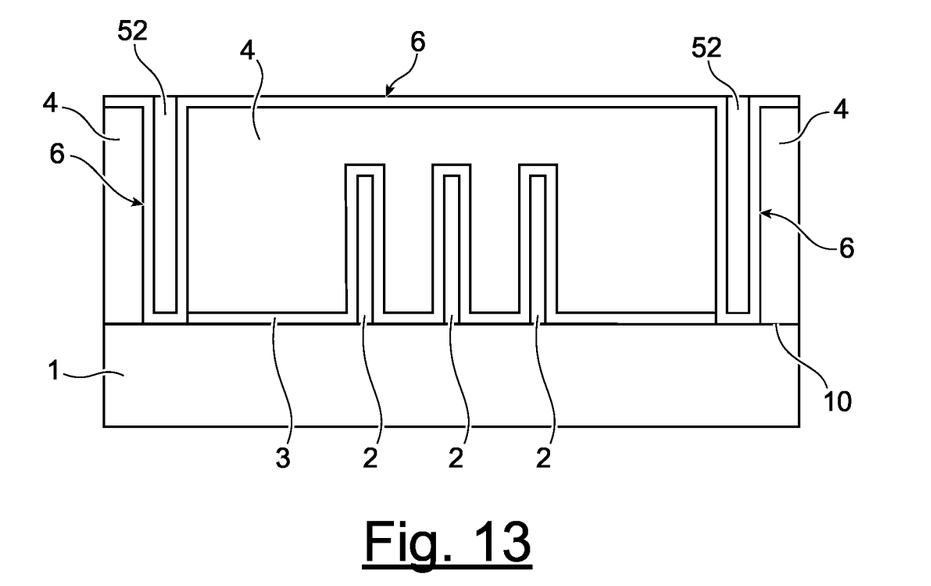
FIG. 13 is a schematic cross-sectional view illustrating step $b_{03}$) of a process according to the invention.

As illustrated in FIG. 13, step b) is advantageously preceded by a step $b_{03}$) of filling the trench 5 with a tungsten (W) type material 52 at the end of step $b_{02}$). Step $b_{03}$) is advantageously followed by a step of chemical-mechanical polishing such that the tungsten (W) type material 52 is flush with the stack.

Figure 11:
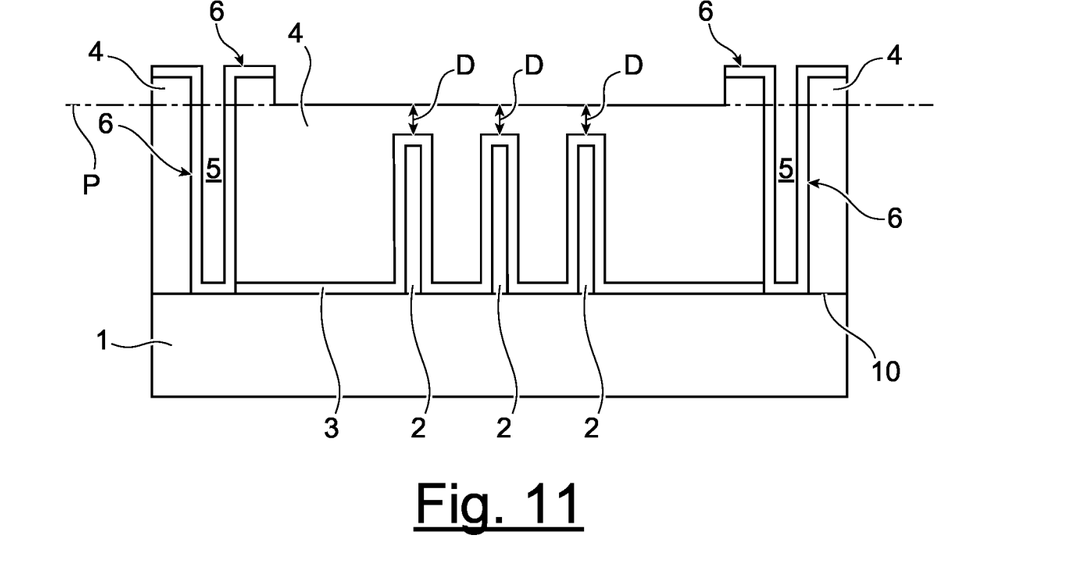
FIG. 11 is a schematic cross-sectional view, illustrating an initial directional etch of a surface portion of the dielectric layer that can be carried out before step b).

Step b) is advantageously preceded by an initial directional etch along the normal to the surface 10 of the substrate 1, of a surface portion of the dielectric layer 4 so as to reach a position P in the stack situated above the pixels 2 of the matrix arrays of pixels 2, at a distance D from the encapsulating layer 3. As illustrated in FIG. 11, the position P reached at the end of the initial directional etch (e.g. dry plasma etch) must be a distance D sufficiently far from the encapsulating layer 3 so as not to damage the upper portion of the pixels 2 by the strong bombardment with ionized gas. By way of non-limiting example, the distance D may be of the order of a hundred nanometres. More precisely, it is possible to consider a distance D greater than or equal to 100 nm having an etch uniformity of the order of 3%.

Step c)

Figure 10:
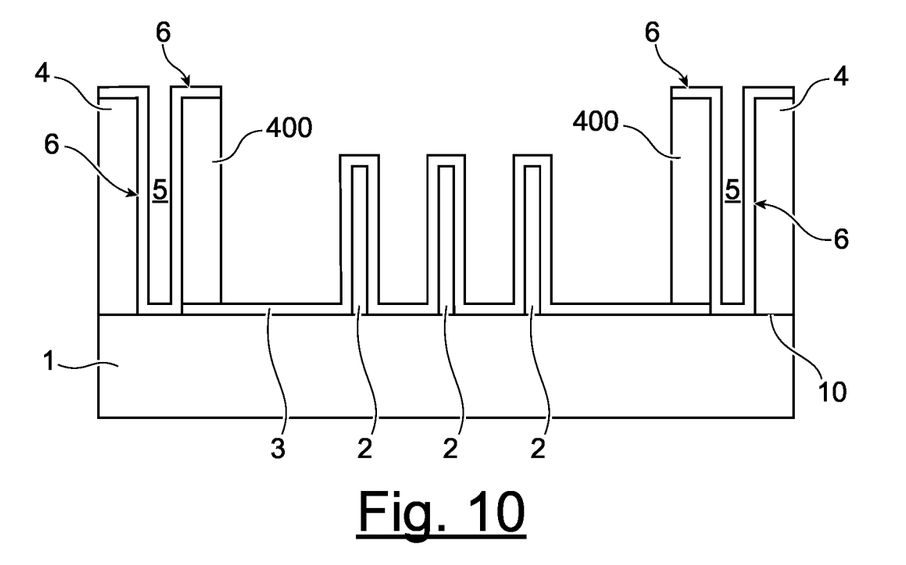
FIG. 10 is a schematic cross-sectional view illustrating the selective etch in step c) of a process according to the invention.

The selective chemical etch performed during step c) is a selective chemical etch of the remaining portion 40 of the dielectric layer 4. As illustrated in FIG. 10, the selective chemical etch performed during step c) is an isotropic etch, but may not be total in the sense that some portions 400 of the remaining portion 40 of the dielectric layer 4 (particularly at the ends of the matrix arrays of pixels 2) may remain at the end of step c). However, in practice, the selective chemical etch carried out during step c) may be total or almost total in the sense that all or almost all of the remaining portion 40 of the dielectric layer 4 has been eliminated at the end of step c).

Step c) is carried out with a chemical etchant that permits selective etching of the remaining portion 40 of the dielectric layer 4 with respect to the encapsulating layer 3. The chemical etchant with which step c) is carried out is advantageously vapour-phase hydrofluoric acid (HF).

Figure 9:
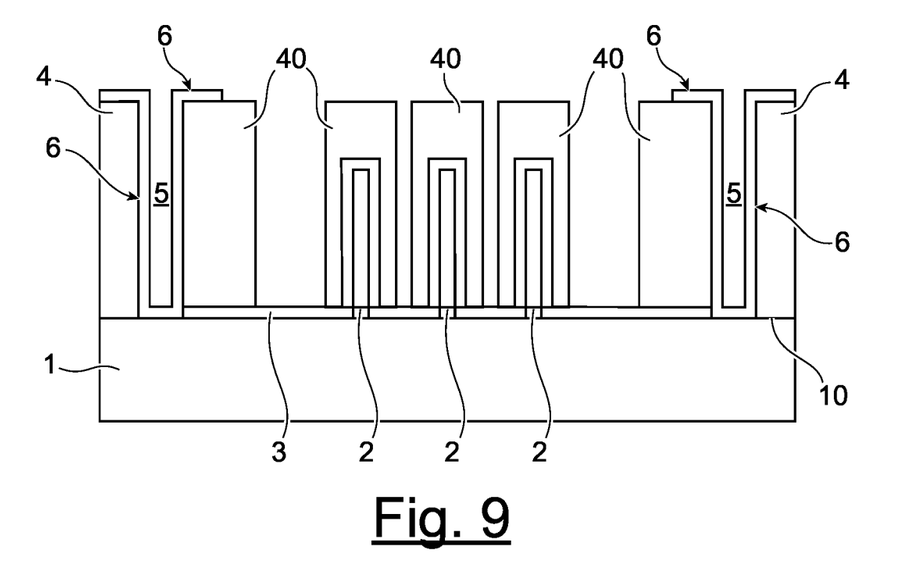
FIG. 9 is a schematic cross-sectional view illustrating step $c_0$) of removing the photolithography mask illustrated in FIG. 7.

As illustrated in FIG. 9, step c) is advantageously preceded by a step $c_0$) of removing the photolithography mask M1 with which step b) can be carried out. The photolithography mask M1 may be a photosensitive resin that is removed from the stack during step $c_0$) by a stripping technique.

Step d)

Figure 12:
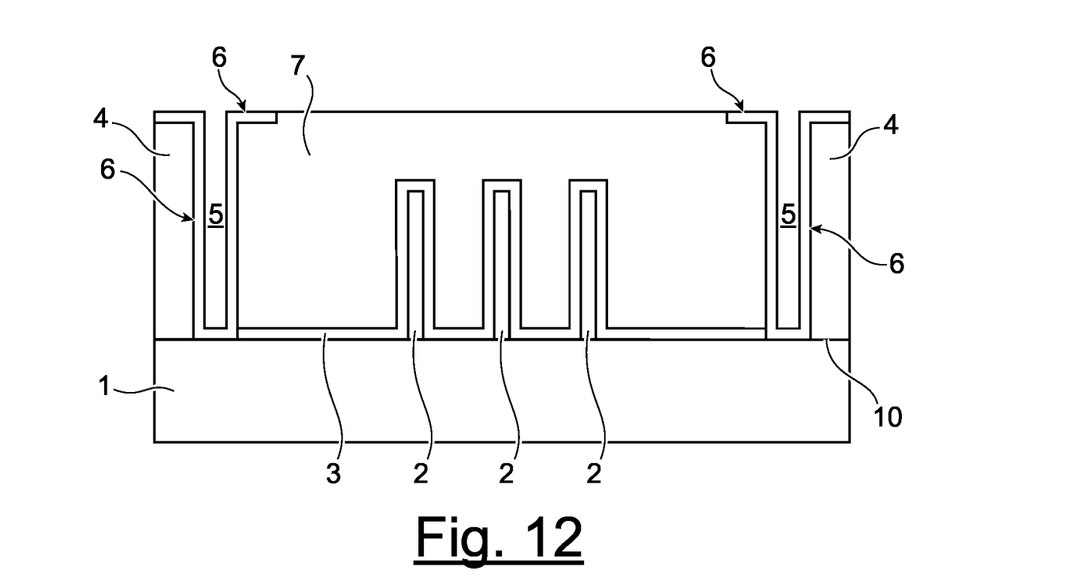
FIG. 12 is a schematic cross-sectional view illustrating step d) of a process according to the invention.

As illustrated in FIG. 12, the process advantageously includes a step d) of forming at least one coloured resin 7 on the encapsulating layer 3 at the end of step c). Said at least one coloured resin 7 is customized for filtration of an emission spectrum of an underlying pixel 2.

Said at least one coloured resin 7 may be a resin of the polymer matrix type having a quantum dot. Said at least one coloured resin 7 may be a resin having pigments that can act as a colour filter.

The invention is not limited to the disclosed embodiments. Those skilled in the art will be capable of considering technically workable combinations thereof and of substituting equivalents therefor.

The invention claimed is:

1. A process for manufacturing an electroluminescent device, comprising:
   a) using a stack comprising, successively:
      a substrate, having a surface;
      matrix arrays of pixels formed on the surface of the substrate, the pixels having a columnar shape and extending along the normal to the surface of the substrate;
      an encapsulating layer arranged to cover the matrix arrays of pixels; and
      a dielectric layer formed on the encapsulating layer;
   b) performing a directional etch along the normal to the surface of the substrate, of a portion of the dielectric layer extending between the pixels of the matrix arrays of pixels, the dielectric layer having a remaining portion remaining at an end of the step b); and
   c) performing a selective chemical etch of the remaining portion of the dielectric layer, the step c) being performed with a chemical etchant that permits selective etching of the remaining portion of the dielectric layer with respect to the encapsulating layer.

2. The process according to claim 1, further comprising a step d) of forming at least one colored resin on the encapsulating layer at the end of the step c), said at least one colored resin being customized for filtration of an emission spectrum of an underlying pixel.

3. The process according to claim 1, wherein:
   the step b) is performed with a photolithography mask having patterns arranged to face the pixels of the matrix arrays of pixels; and
   the step c) is preceded by a step $c_0$) of removing the photolithography mask.

4. The process according to claim 1, wherein the step b) is preceded by the following steps:
   $b_{01}$) forming a trench between adjacent matrix arrays of pixels that has a bottom wall and side walls; and
   $b_{01}$) depositing a barrier layer on the bottom wall and on the side walls, the barrier layer being made of a material selected according to the chemical etchant with which the step c) is performed, so as to obtain an etch stop layer during performance of the step c).

5. The process according to claim 1, wherein the chemical etchant with which the step c) is performed is vapour-phase hydrofluoric acid.

6. The process according to claim 4, wherein the barrier layer deposited during the step $b_{02}$) is made of at least one material selected from aluminium (Al), alumina ($Al_2O_3$), and aluminium nitride (AlN).

7. The process according to claim 4, wherein the step b) is preceded by a step $b_{03}$) of filling the trench with tungsten at the end of the step $b_{02}$).

8. The process according to claim 1, wherein the step b) is preceded by an initial directional etch along the normal to the surface of the substrate, of a surface portion of the dielectric layer so as to reach a position in the stack situated above the pixels of the matrix arrays of pixels, at a distance from the encapsulating layer.

9. The process according to claim 1, wherein the encapsulating layer of the stack used in the step a) is made of at least one material selected from aluminium (Al), alumina ($Al_2O_3$), and aluminium nitride (AlN).

10. The process according to claim 1, wherein the dielectric layer of the stack used in the step a) is made of silicon dioxide.

* * * * *

UNITED STATES PATENT AND TRADEMARK OFFICE
CERTIFICATE OF CORRECTION

PATENT NO. : 12,272,762 B2
APPLICATION NO. : 18/766529
DATED : April 8, 2025
INVENTOR(S) : Romain Sommer et al.

Page 1 of 1

It is certified that error appears in the above-identified patent and that said Letters Patent is hereby corrected as shown below:

In the Claims

In Column 8, Claim 4, Line 19, delete "$b_{01}$)" and insert -- $b_{02}$) --, therefor.

Signed and Sealed this
Twenty-fifth Day of November, 2025

John A. Squires
*Director of the United States Patent and Trademark Office*